US011194360B2

(12) United States Patent
Hasse et al.

(10) Patent No.: US 11,194,360 B2
(45) Date of Patent: Dec. 7, 2021

(54) SHAKEPROOF MODULAR COMPUTER SYSTEM

(71) Applicant: dSPACE digital signal processing and control engineering GmbH, Paderborn (DE)

(72) Inventors: Dirk Hasse, Paderborn (DE); Ralf-Peter Fietz, Paderborn (DE); Robert Breicher, Paderborn (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 0 days.

(21) Appl. No.: 16/784,291

(22) Filed: Feb. 7, 2020

(65) Prior Publication Data

US 2021/0132651 A1    May 6, 2021

(30) Foreign Application Priority Data

Oct. 30, 2019    (DE) .......................... 102019129272.7
Feb. 4, 2020    (DE) .......................... 102020102749.4

(51) Int. Cl.
| | |
|---|---|
| *G06F 1/16* | (2006.01) |
| *H05K 5/02* | (2006.01) |
| *H05K 5/03* | (2006.01) |
| *H05K 7/14* | (2006.01) |

(52) U.S. Cl.
CPC ............. *G06F 1/16* (2013.01); *H05K 5/0221* (2013.01); *H05K 5/0256* (2013.01); *H05K 5/03* (2013.01); *H05K 7/1451* (2013.01)

(58) Field of Classification Search
CPC ....................................................... G06F 1/181
See application file for complete search history.

(56) References Cited

U.S. PATENT DOCUMENTS

| | | | | |
|---|---|---|---|---|
| 6,373,692 | B1 * | 4/2002 | Cheng ..................... | G06F 1/181 |
| | | | | 220/4.02 |
| 2005/0270298 | A1 * | 12/2005 | Thieret ................. | G06F 13/409 |
| | | | | 345/502 |
| 2009/0231798 | A1 * | 9/2009 | Skinner ................... | G06F 1/185 |
| | | | | 361/679.31 |

FOREIGN PATENT DOCUMENTS

| | | |
|---|---|---|
| CN | 107908243 A | 4/2018 |
| WO | WO 9737293 A1 | 10/1997 |

* cited by examiner

*Primary Examiner* — Jerry Wu
(74) *Attorney, Agent, or Firm* — Leydig, Voit & Mayer, Ltd.

(57) ABSTRACT

A modular computer system includes: a housing; at least one container; a data connection; and a housing cover. The at least one container in a lowered state is configured to be connected to a motherboard of the computer system via at least one data connection installed on the outside of the at least one container. The data connection is for exchanging data between pluggable circuit boards in the at least one container and the motherboard of the computer system while the at least one container is in the lowered state. The housing cover is configured to be fixed on the housing. A container holding device is installed on the housing cover, wherein the container holding device is configured to exert a force on the at least one container to fix the at least one container in a shakeproof manner in the housing after the housing cover has been fixed on the housing.

12 Claims, 3 Drawing Sheets

SHAKEPROOF MODULAR COMPUTER SYSTEM

CROSS-REFERENCE TO PRIOR APPLICATIONS

Priority is claimed to German Patent Application No. DE 102019129272.7, filed on Oct. 30, 2019, and to German Patent Application No. DE 102020102749.4, filed on Feb. 4, 2020.

FIELD

The invention relates to modular computer systems for field use.

BACKGROUND

Modular computer systems are designed according to a modular principle, which allows components of the computer system to be exchanged or the computer system to be expanded by components. A modular computer system may comprise, for example, insertion bays for pluggable circuit boards according to the Peripheral Component Interconnect Express (PCIe) standard. Modular computer systems provided for control, monitoring or development tasks in field use are often designed to be shakeproof, in order to avoid detachment, slippage and damage to pluggable circuit boards and other components as a result of vibration or shock. An example is the RE0412 Rugged Embedded Computer of Crystal Group, Inc.

A frequently occurring problem with such computer systems is the accessibility of the slots in field use. In the automotive industry, for example, it is customary to carry computer systems provided for developing driver assistance systems during test drives in the trunk and to screw them firmly in place there. The computer system is therefore not readily removable from the trunk, which can make the exchange of circuit boards very difficult, in particular if the form factor of the circuit boards provides a screwing of the circuit boards, as is the case, for example, in the PCIe standard.

In the prior art, for example from patent specifications CN 107 908 243 and WO 1997 037 293 A1, modular computer systems provided for field use are known, in which components intended to be replaced are accommodated in a container which can be removed from the respective computer system. Both CN 107 908 243 and WO 1997 037 293 A1 describe measures for dampening mechanical shocks against the computer system but not measures against detachment, slippage or damage to pluggable circuit boards as a result of vibration or shaking. In addition, the computer systems described in CN 107 908 243 and WO 1997 037 293 A1 would be accessible only with difficulty if they were fastened in a trunk of an automobile as described above.

SUMMARY

In an exemplary embodiment, the present invention provides a modular computer system. The modular computer system includes: a housing; at least one container for circuit boards, wherein the at least one container is configured to be lowered into the housing, wherein container slots are installed in the interior of the at least one container with data connections for receiving pluggable circuit boards, wherein at least one data connection is installed on the outside of the at least one container, and wherein the at least one container in a lowered state is configured to be connected to a motherboard of the computer system via the at least one data connection installed on the outside of the at least one container; a data connection, integrated into the at least one container, between the at least one data connection on the outside of the at least one container and the data connections in the interior of the container, for exchanging data between the pluggable circuit boards in the at least one container and the motherboard of the computer system while the at least one container is in the lowered state; and a housing cover configured to be fixed on the housing and on which a container holding device is installed, wherein the container holding device is configured to exert a force on the at least one container to fix the at least one container in a shakeproof manner in the housing after the housing cover has been fixed on the housing.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
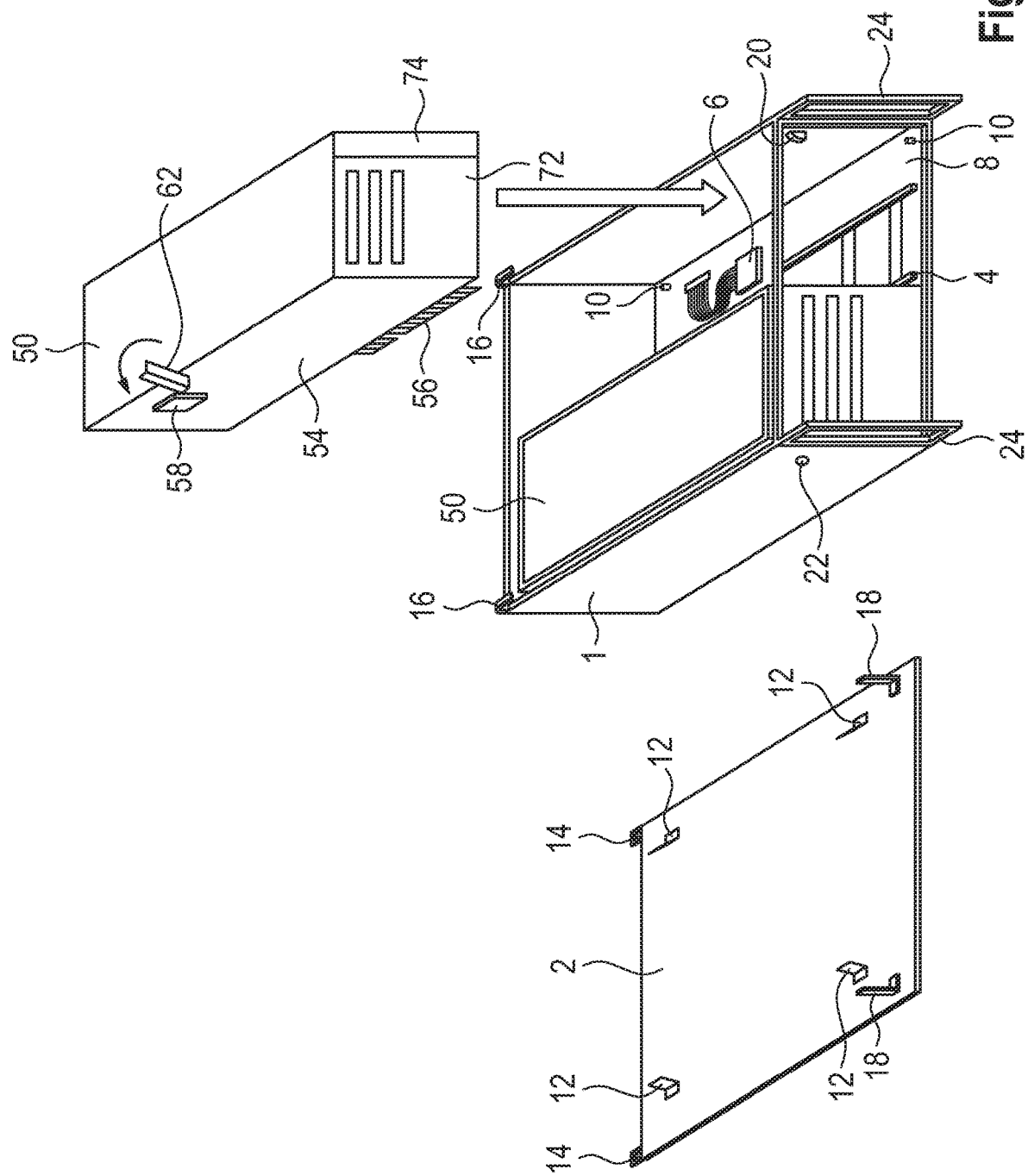
FIG. 1 depicts an overall view of a computer system in an exemplary embodiment.

Exemplary embodiments of the invention provide a structure of a modular computer system which ensures vibration resistance sufficient for being carried in an automobile, in particular a trunk, even under rough conditions, while at the same time allowing easy accessibility of the pluggable circuit boards of the computer system.

The computer system, which may be configured for fastening in a trunk of a vehicle, comprises a housing and at least one container for circuit boards that can be lowered into the housing. Slots with data connections for receiving pluggable circuit boards are installed in the interior of the container, and at least one data connection on the outside of the container is installed, via which data connection the container lowered in the housing is communicatively connected or connectable manually to a motherboard of the computer system. A data connection is integrated into the container between the at least one data connection on the outside of the container and the data connections in the interior thereof, and allows data to be exchanged between circuit boards inserted in the container and the motherboard of the computer system after the container has been lowered in the computer system.

The computer system furthermore comprises a housing cover which can be firmly fixed on the housing and on which a container holding device is installed. The container holding device is configured to exert a force on the container, which fixes the container in a shakeproof manner in the housing, after the housing cover has been fixed on the housing.

This design with a removable housing cover and a container which can be lowered from above, i.e., is also removable from above, brings about easy accessibility of the pluggable circuit boards even when the computer system is installed in confined conditions. Exchanging a circuit board or adding a new circuit board can take place at any location after removal of the container from the computer system, and can thus be carried out easily, even if the form factor of the circuit boards provides their screwing on the slot, as is the case in particular with the Peripheral Component Interconnect (PCI) and PCIe form factors. Since the housing cover is configured to exert a force on the container, which fixes the container after the cover has been closed, the containers with the pluggable circuit boards are fixed in the housing of the computer system in a shakeproof manner when the housing cover is closed. The computer system thus offers a very advantageous combination of vibration resistance and easy accessibility of the pluggable circuit boards during typical use in a trunk.

In practice, it is frequently the case that, after the computer system has been installed in a trunk, only the front side of the computer system is conveniently accessible, because its rear side is covered by a trunk cover, for example. It is therefore advantageous if the housing cover can be removed from the housing and fixed on the housing solely by manual operation in the region of the front side of the computer system. For this purpose, the housing can be provided in the region of the front side of the computer system with a latching device into which the housing cover can be latched by depressing the housing cover in the region of the front side of the computer system and which can be released by actuating a release device, for example two push buttons on the side walls of the housing.

The housing cover can advantageously be separated from the housing by a pulling movement after raising the housing on the front side of the computer system to an acute angle relative to the housing, which advantageously is not more than 30°. In this embodiment, the housing cover can be easily removed even when the computer system is partially covered in the region of its rear side.

The container holding device advantageously comprises a spring device of a high degree of stiffness which is installed on the housing cover and configured and positioned on the housing cover in such a way that it is tensioned by an outside wall of the container when the housing cover is fixed in order to exert a force on the container as a result of the tensioning. In this embodiment, the housing cover can be inserted in the region of the rear side of the computer system into a rotatable mounting on the housing, which enables the depression of the housing cover after the insertion of the housing cover into the mounting. As a result, when the housing cover is fixed by manual operation in the region of the front side of the computer system, i.e., when the housing cover is depressed after insertion into the rotatable mounting for the purpose of fixing the housing cover, a lever action of the housing cover is utilized to compress the spring device. As a result, the spring device can be configured with a particularly high degree of stiffness in order to exert a particularly large force on the container for the better fixing of the container after the housing cover has been fixed.

Advantageously, the computer system comprises a guiding device for the container, which forces the container to be lowered in a predetermined spatial orientation relative to the housing and fixes the container along the spatial directions parallel to the housing cover after the housing cover has been fixed. This measure improves the protection of the container against twisting or lateral slippage, which is provided without the guiding device solely by the static friction of the container on the bottom of the housing and on the housing cover. If at least one data connection on the outside of the container is configured as a wireless plug connection, the guiding device can also be configured to force correct insertion of the plug connection of the container into a slot when the container is lowered into the housing.

A data connection on the outside of the container can also be configured as a pluggable cable connection, preferably as a cable connection which can be plugged into a slot of the container. The computer system furthermore preferably comprises a locking device for the shakeproof locking of the pluggable cable connection, in order to prevent the cable connection from slipping out as a result of shock or vibration.

An embodiment having a pluggable cable connection can be advantageous for the high-speed data transmission between pluggable circuit boards in the container and the motherboard of the computer system, because many plug connections available on the market, in particular in the PCIe standard, are not suitable for high data rates. Accordingly, the pluggable cable connection is advantageously configured as a high-speed data connection and comprises a data cable optimized for high-speed data transmission.

For the shakeproof fixation of the circuit boards within the container, the computer system advantageously comprises a removable container cover of the container which can be firmly fixed on the container and on which a circuit board holding device is installed for each slot of the container provided for insertion of a pluggable circuit board, which circuit board holding device is configured to receive an edge of a pluggable circuit board opposite a slot when the container cover is fixed on the container and to fix the respective pluggable circuit board in the slot in a shakeproof manner.

The drawings and their subsequent descriptions describe an exemplary embodiment of a computer system according to the present invention that meets the requirements of ISO 16750 with respect to the mechanical loads for road vehicle test systems.

FIG. 1 shows a partially disassembled modular computer system with a housing 1 and two examples of a container 50, which can be lowered in the housing 1 and removed from the housing 1, for pluggable circuit boards 52, one of which is removed from the housing 1 and one is lowered in the housing 1, and furthermore a removable housing cover 2 of the computer system lying next to the housing 1. The housing 1 comprises two handles 24, installed on the front side, for removing the housing 1 from a trunk 40.

A riser card 54 having slots for pluggable circuit boards 52 forms a side wall of the container 50. A removable side container cover 60 forms the side wall of the container 50 opposite the riser card 54. The riser card 54 includes a wireless plug connection 56 and a pluggable cable connection 58 configured as a high-speed data connection. The housing comprises a base plate 8, on which a slot 4 for the wireless plug connection 56 is installed for each container 50, along with a data cable 6 that is configured for high-speed data transmission and is pluggable onto the pluggable cable connection 58. By inserting the wireless plug connection 56 into the slot 4 and plugging the data cable 6 onto the pluggable cable connection 58, the container 50 lowered in the housing 1 can be communicatively connected to a motherboard of the computer system installed below the base plate 8. Guiding bolts 10 installed on the base plate 8 form a guiding device, which forces the container 50 to be lowered in a spatial direction oriented in parallel to the longitudinal axis of the housing 1 and thereby ensures correct insertion of the wireless plug connection 56 into the slot 4. After the container 50 has been lowered and the housing cover 2 has been fixed on the housing 1, the guiding bolts 10 fix the container 50 along the spatial directions parallel to the housing cover 2 and the base plate 8, in order to prevent twisting and lateral slippage of the container 50 in the housing 1.

Figure 2:
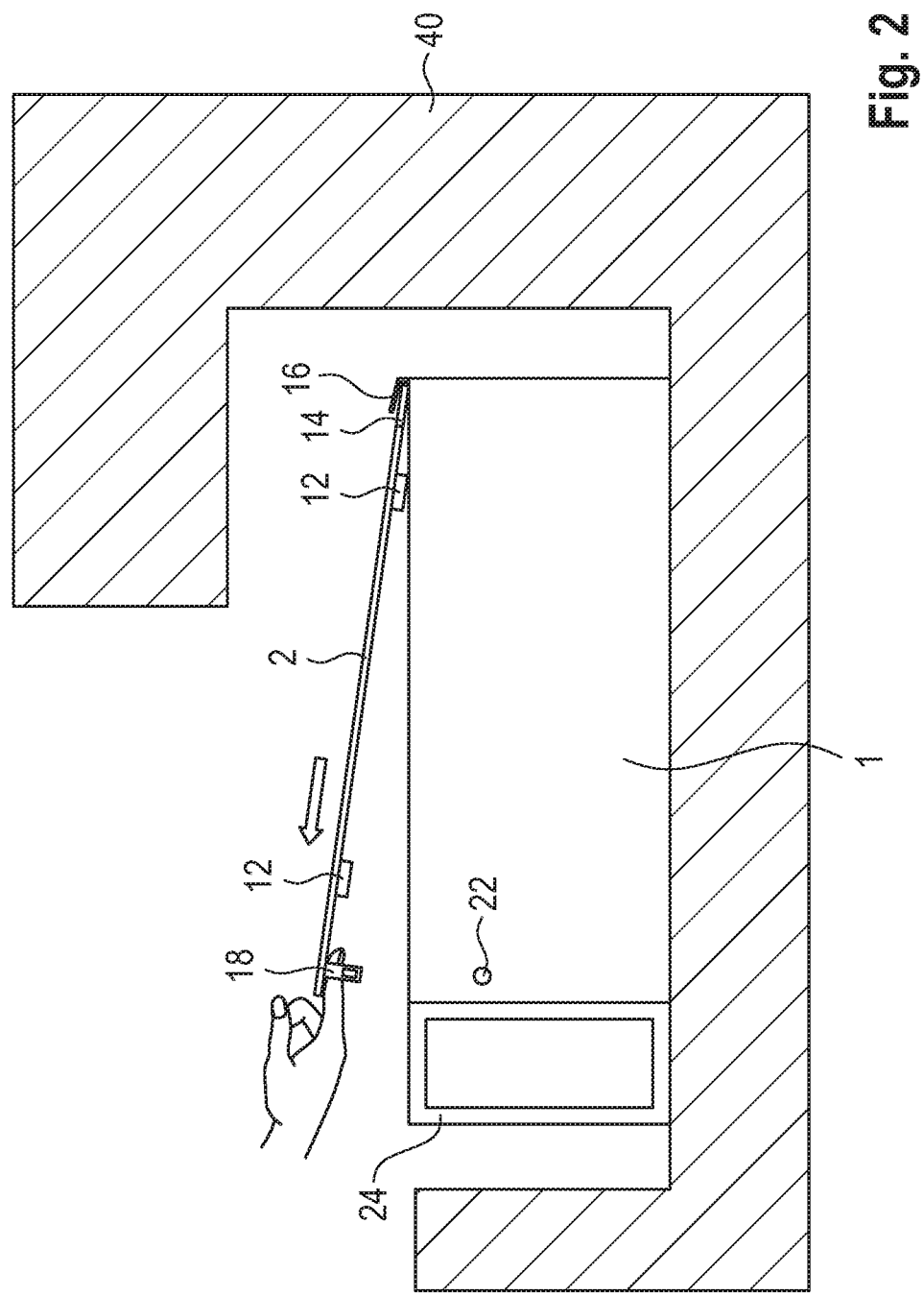
FIG. 2 depicts a side view of the computer system stowed in a trunk.

A container holding device is in the form of a spring device composed of four leaf springs 12. Two retaining straps 14 for insertion into an insertion device 16 of the housing and two locking springs 18 configured for latching in a latching device 20 of the housing 1 are installed on the housing cover 2. FIG. 2 shows a side view of the computer system installed in a trunk 40 of a sedan and illustrates the removal of the housing cover 2 from the housing 1 or the fixing of the housing cover 2 on the housing. The figure shows how the housing cover can be inserted into the insertion device 16 at an acute angle relative to the housing 1. The insertion device 16 forms a rotatable mounting for the retaining straps 14. After the insertion of the housing cover 2 into the insertion device 16, the raising angle of the housing cover 2 can therefore be changed by raising the housing cover 2 on the side opposite the restraining straps 14. Advantageously, the computer system also comprises protection against lateral slippage of the housing cover 2 after the insertion of the retaining straps 14 into the insertion device 16.

Each of the locking springs 18 comprises an opening, and the latching device 20 is configured and arranged inside the housing 1 in such a way that, when the housing cover 2 inserted into the insertion device 16 is depressed, the locking springs 18 slide over the latching device 20 and are tensioned by the latching device 20 in the process. As soon as the openings of the locking springs 18 lie above the latching device 20, the locking springs 18 spring back into their rest position, wherein the latching device 20 engages in the opening of the locking springs 18 and fixes the housing cover 2 on the housing 1.

The leaf springs 12 are dimensioned and arranged on the housing cover 2 in such a way that they are tensioned by the top outer wall of a container 50 when the housing cover 2 is depressed and, after the housing cover 2 has been fixed, are in a tensioned state and exert a force on the container 50 which fixes the container 50 in a shakeproof manner in the housing 1. It is provided that the housing cover 2 is depressed in the region of the front side of the computer system, i.e., approximately at the height of the locking springs 18, such that a lever action of the housing cover is utilized for compressing the leaf springs 12. As a result, the leaf springs 12 can have a high degree of stiffness. Based on the higher lever action there, the stiffness of the two rear leaf springs is advantageously higher than the stiffness of the two front leaf springs.

On both side walls, the housing 1 comprises a release device 22 for releasing the housing cover 2 from the latching device 20. The release device 22 is a mechanical push button which is arranged to, when actuated, bend the latched locking springs 18 of the housing cover 2 fixed on the housing 1 inward, in order to release the latching device 20 from the openings of the locking springs 18. As soon as this has taken place, the leaf springs 12 lift the housing cover 2 a little from the housing 1, such that the housing cover 2 can be easily raised to an acute angle and separated from the housing 1 by a pulling movement.

As a whole, it can be seen in the figure that the housing cover 2 can be removed from the housing 1 and can be fixed on the housing 1 without tools and solely by manual operation in the region of the front side of the computer system, which significantly facilitates access to components of the computer system when it is installed in a trunk 40 or in similarly confined conditions.

Figure 3:
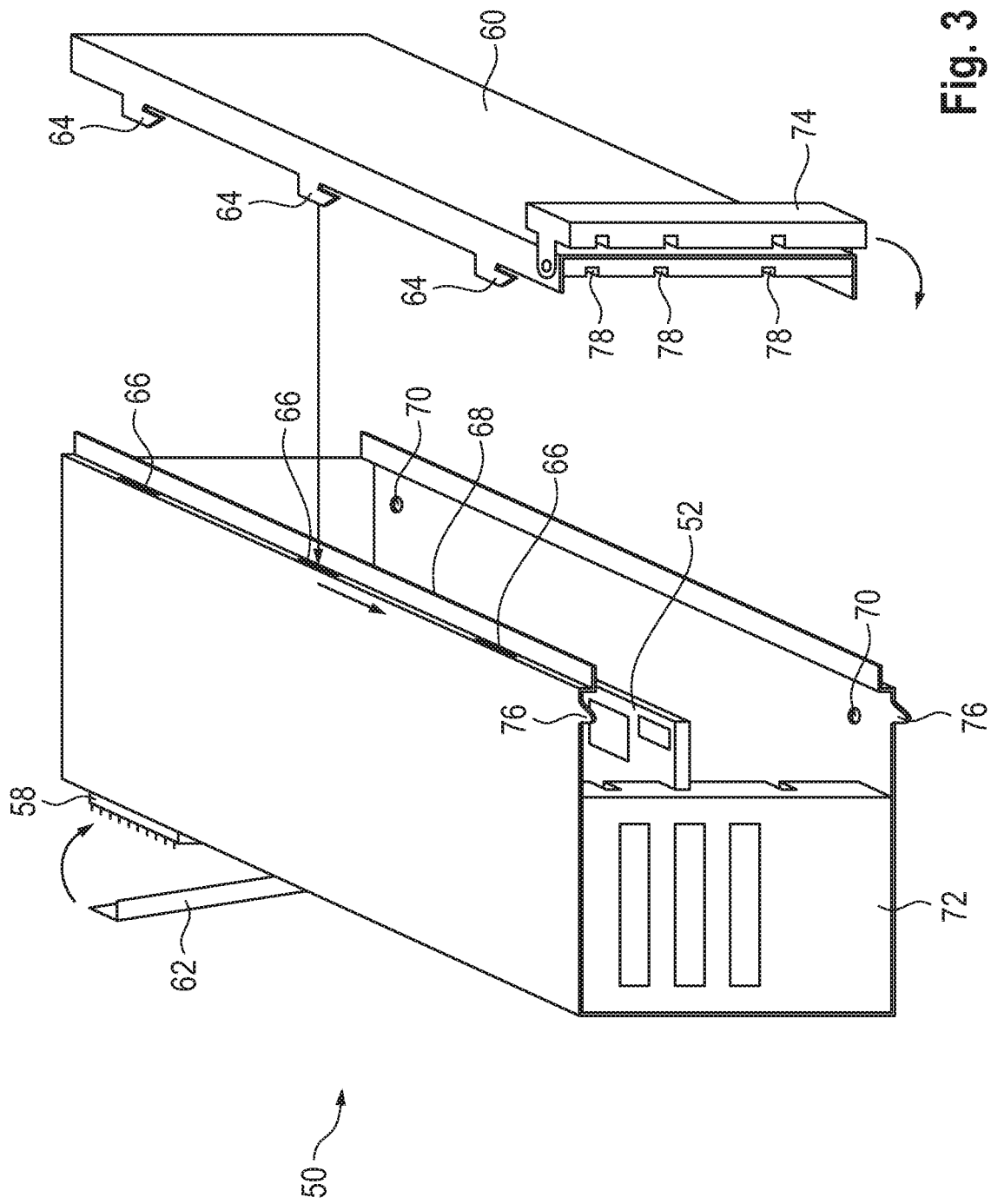
FIG. 3 depicts a detailed view of a container of the computer system.

FIG. 3 shows a detailed view of a container 50 with the container cover 60 removed and a pluggable circuit board 52 inserted into a slot of the container 50. The container 50 comprises a foldable locking device 62 configured to lay over the inserted data cable 6, to prevent its detachment as a result of vibration or shock and to in this way lock the pluggable cable connection in a shakeproof manner. The container 50 also comprises openings 70 for receiving the guiding bolts 10 when the container 50 is lowered. Before the container 50 is removed from the housing 1, the locking device 62 is folded upward and the pluggable cable connection 58 is released. In this way, the container 50 can, easily and without tools, be removed from the housing 1 and be lowered in the housing 1.

In its interior, the container 50 comprises slots, arranged on the riser card 54, with data connections for receiving pluggable circuit boards 52 and furthermore data lines, laid in the riser card 54, between the slots and the data connections on the outside of the container 50, i.e., the wireless plug connection 56 and the pluggable cable connection 58, for exchanging data between circuit boards 52 plugged into the container 50 and the motherboard of the computer system.

The container comprises a rail device 68 for receiving the container cover 60 and slits 66 for receiving retaining hooks 64 arranged on the container cover 60. The container cover 60 can be placed onto the container 50 by inserting the retaining hooks 64 into the slits 66 and subsequently moving the container cover 60 on the rail device 68 in the direction of the front side of the container 50. For fixing the container cover 60 firmly on the container 50, a foldable fixing device 74 is installed on the container cover 60, and is configured to combine with a front element 72 of the container 50 to form a front panel of the container 50 after the container cover 60 has been placed and the fixing device 74 has been folded, and to prevent the container cover 60 from slipping on the rail device 68. Two retaining lugs 76 are arranged on the container 50 in such a way that, when the container cover 60 has been fixed on the container 50, they are covered by the fixing device 74 and exert a torque acting in the closing direction of the fixing device 74 on the fixing device 74 when a pulling force is exerted on the container cover 60 and is directed away from the front element 72.

For each slot of the container 50, the container cover 60 comprises a circuit board holding device 78, which is configured to receive an edge of a pluggable circuit board 52 opposite a slot and to fix the pluggable circuit board 52 in the slot in a shakeproof manner.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A modular computer system, comprising:
a housing;
at least one container for circuit boards, wherein the at least one container is configured to be lowered into the housing, wherein the at least one container comprises container slots installed in the interior of the at least one container with data connections for receiving pluggable circuit boards, wherein the at least one container further comprises at least one data connection installed on the outside of the at least one container, and wherein the at least one container in a lowered state is configured to be connected to a motherboard of the computer system via the at least one data connection installed on the outside of the at least one container;
a data connection, integrated into the at least one container, between the at least one data connection on the outside of the at least one container and the data connections in the interior of the container, for exchanging data between the pluggable circuit boards in the at least one container and the motherboard of the computer system while the at least one container is in the lowered state; and
a housing cover configured to be fixed on the housing and on which a container holding device is installed, wherein the container holding device comprises a spring device which is installed on the housing cover and which is configured and positioned on the housing cover such that the spring device is tensioned by a top outer wall of the at least one container when the housing cover is fixed such that, after the housing cover is fixed on the housing, the spring device is in a tensioned state and exerts a force on the top outer wall of the at least one container to fix the at least one container in a shakeproof manner in the housing;
wherein the housing cover is configured to be removed from the housing and to be fixed on the housing by manual operation in a region of the front side of the computer system;
wherein the housing cover is configured be removed from the housing based on a pulling movement after raising the housing cover on the front side of the computer system to an acute angle relative to the housing;
wherein at least one retaining strap of the housing cover is configured to be inserted, at an acute angle relative to the housing, into a rotatable mounting on the housing in a region of the rear side of the computer system before being fixed on the housing such that, and wherein a lever action of the housing cover is configured to tension the spring device when the housing cover is fixed by manual operation of lowering the housing cover in the region of the front side of the computer system.

2. The computer system according to claim 1, further comprising:
a removable container cover of the at least one container configured to be fixed on the at least one container and on which a circuit board holding device is installed for each slot of the at least one container, wherein the circuit board holding device is configured to receive an edge of a respective pluggable circuit board opposite a slot and to fix the respective pluggable circuit board in a shakeproof manner in the slot while the container cover is fixed on the at least one container.

3. The computer system according to claim 1, wherein the form factor of the pluggable circuit boards includes screwing of the pluggable circuit boards on the slot.

4. The computer system according to claim 1, further comprising:
a guiding device configured to force the at least one container to be lowered in a predetermined spatial orientation relative to the housing and to fix the at least one container along the spatial directions parallel to the housing cover after the housing cover has been fixed.

5. The computer system according to claim 4, wherein the at least one data connection on the outside of the container comprises a wireless plug connection and the guiding device is configured to force correct insertion of a plug connection into a slot when the at least one container is lowered.

6. The computer system according to claim 1, wherein the at least one data connection on the outside of the container comprises a pluggable cable connection.

7. The computer system according to claim 6, wherein the pluggable cable connection is configured as a high-speed data connection.

8. The computer system according to claim 6, further comprising:
a locking device for locking the pluggable cable connection in a shakeproof manner.

9. The computer system according to claim 1, further comprising:
a latching device for fixing the housing cover on the housing such that the housing cover mounted in the rotatable mounting is configured to be latched in the latching device based on depressing the housing cover onto the housing; and
a release device for releasing the housing cover from the latching device.

10. The computer system according to claim 1, wherein the computer system is configured to be fastened in a trunk of a vehicle.

11. The computer system according to claim 1, wherein the pluggable circuit boards are Peripheral Component Interconnect (PCI) or Peripheral Component Interconnect Express (PCIe) pluggable circuit boards.

12. The computer system according to claim 1, wherein the acute angle to which the housing cover is raised for removing the housing cover is in the range of 30° or less.

* * * * *